(12) United States Patent
Lin et al.

(10) Patent No.: US 9,881,959 B2
(45) Date of Patent: Jan. 30, 2018

(54) CHIP PACKAGE AND METHOD OF MANUFACTURING THE SAME

(71) Applicant: XINTEC INC., Taoyuan (TW)

(72) Inventors: Po-Shen Lin, Taoyuan (TW);
Chia-Sheng Lin, Taoyuan (TW);
Yi-Ming Chang, Taoyuan (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/819,348

(22) Filed: Aug. 5, 2015

(65) Prior Publication Data

US 2016/0049436 A1    Feb. 18, 2016

(30) Foreign Application Priority Data

Aug. 13, 2014    (TW) .............................. 103127799 A (51) Int. Cl.
*H01L 27/146*    (2006.01)

(52) U.S. Cl.
CPC .... *H01L 27/14636* (2013.01); *H01L 27/1464* (2013.01); *H01L 27/14618* (2013.01); *H01L 27/14685* (2013.01); *H01L 27/14687* (2013.01); *H01L 27/14621* (2013.01); *H01L 27/14627* (2013.01)

(58) Field of Classification Search
CPC ......... H01L 27/14621; H01L 27/14627; H01L 2924/0002; H01L 27/14634; H01L 27/14636; H01L 27/1464; H01L 2924/00; H01L 2224/13; H01L 2225/06593; H01L 23/544; H01L 27/14605; H01L 27/14618; H01L 27/146

USPC ........... 257/432, E31.127, E31.11, 443, 447; 438/70

See application file for complete search history.

(56) References Cited

U.S. PATENT DOCUMENTS

| 2011/0233782 A1 | 9/2011 | Chang et al. |
| 2012/0068292 A1* | 3/2012 | Ikeda .................. G02B 13/006 257/432 |
| 2013/0069188 A1* | 3/2013 | Chen ................. H01L 27/14605 257/432 |
| 2015/0091115 A1* | 4/2015 | Lin ..................... H01L 27/1463 257/432 |

(Continued)

FOREIGN PATENT DOCUMENTS

| CN | 103066081 | 4/2013 |
| CN | 103579377 | 2/2014 |

(Continued)

*Primary Examiner* — William F Kraig
*Assistant Examiner* — Edward Chin
(74) *Attorney, Agent, or Firm* — Liu & Liu (57) ABSTRACT

A method of manufacturing chip package includes providing a semiconductor substrate having at least a photo diode and an interconnection layer. The interconnection layer is disposed on an upper surface of the semiconductor substrate and above the photo diode and electrically connected to the photo diode. At least a redistribution circuit is formed on the interconnection layer. The redistribution circuit is electrically connected to the interconnection layer. A packaging layer is formed on the redistribution circuit. Subsequently, a carrier substrate is attached to the packaging layer. A color filter is formed on a lower surface of the semiconductor substrate. A micro-lens module is formed under the color filter. The carrier substrate is removed.

18 Claims, 9 Drawing Sheets

(56) References Cited

U.S. PATENT DOCUMENTS

2015/0102445 A1\* 4/2015 Testa ................ H01L 27/14636
257/432

FOREIGN PATENT DOCUMENTS

| TW | 201133725 | 10/2011 |
| TW | 201351629 | 12/2013 |
| TW | 201405791 | 2/2014 |

\* cited by examiner

CHIP PACKAGE AND METHOD OF MANUFACTURING THE SAME

RELATED APPLICATIONS

This application claims priority to Taiwanese Application Serial Number 103127799, filed Aug. 13, 2014, which is herein incorporated by reference.

BACKGROUND

Field of Invention

The present invention relates to a package and method of manufacturing the same. More particularly, the present invention relates to a chip package and method of manufacturing the same.

Description of Related Art

Digital camera requires the function of image sensing, and digital camera is integrated into portable devices, for example, tablet, smart phones and laptops. CMOS image sensor (CIS) is widely used as an essential component in the digital camera. Photo diode is the foundation of CIS chip package. When light strikes the photo diode, an electronic current is generated which is in positive correlation with the number of photons. A voltage signal, which reflects the number of photons in a given time, can then be generated. This signal is converted to digital signal and output through the circuit of the abovementioned device.

An early development of the CIS chip package is a front side illuminated (FSI) sensing system. However, in the front side illuminated CIS device, the incident photons have to pass through a metal layer and a dielectric layer to arrive at the photo diode, and the quantum efficiency may be compromised because the incident photons are absorbed or scatter randomly before they arrive at the photo diode. Hence, back side illuminated (BSI) CIS is developed to overcome this issue. The back side illuminated CIS chip package receives light from the back of the semiconductor substrate. The light path is relatively short and it does not need to go through the metal layer and the dielectric layer or other intermediate layers. Thus, the incident photons will not be absorbed or scatter before they arrive the photo diode, and a higher quantum efficiency can be satisfied. The back side illuminated CIS chip package is commonly used in electronic devices.

However, many difficulties remain in the manufacturing of the back side illuminated CIS chip package, especially the high production cost, thicker profile. An urgent need is calling to provide a new structure and method so as to tackle the problems.

SUMMARY

The invention provides a chip package and method of manufacturing the same. In general, in the manufacturing of the back side illuminated CIS chip package, firstly epitaxial layer is deposited on the semiconductor substrate to form the interconnection structure that electrically connects each pixel. Subsequently, the photo diode is formed on the interconnection structure of a higher cost wafer feeding. Conventional front side illuminated system starts with the formation of the photo diode on the semiconductor substrate, and the interconnection structure is conformingly formed on the photo diode. Compared with the front side illuminated system, the back side illuminated system requires more complex process and higher precision in the manufacturing process. Therefore, the production cost of the back side illuminated system is much higher. Meanwhile, the back side illuminated CIS chip package requires through silicon via (TSV) to achieve electrical conductive path of the interconnection structure at the back of the semiconductor substrate. The production cost of this step is even higher. In addition, TSV formation can only be performed under certain thickness. Hence, back side illuminated CIS chip package usually has thicker profile. Accordingly, the instant disclosure provides a back side illuminated chip package that is made by front-side-illuminated like wafer feeding which can reduce production cost and more suitable for mass production. In addition, the chip package and method of manufacturing the chip package does not require TSV so as to save production process and cost, and the profile of the chip package is reduced.

According to some embodiments of the instant disclosure, a method of manufacturing chip package includes providing a semiconductor substrate having at least a photo diode and an interconnection layer. The interconnection layer is disposed on an upper surface of the semiconductor substrate and above the photo diode and electrically connected to the photo diode. Then, at least a redistribution circuit is formed on the interconnection layer. The redistribution circuit is electrically connected to the interconnection layer. Next, a packaging layer is formed on the redistribution circuit. Subsequently, a carrier substrate is attached to the packaging layer. A colour filter is formed on a lower surface of the semiconductor substrate. Following that, a micro-lens module is formed under the colour filter. Finally, the carrier substrate is removed.

In some embodiments of the instant disclosure, before forming the colour filter under the semiconductor substrate further includes thinning the semiconductor substrate from the lower surface towards the upper surface.

In some embodiments of the instant disclosure, thinning the semiconductor substrate from the lower surface towards the upper surface is conducted by mechanical polishing, chemical base etching, chemical mechanical polishing or the combination thereof.

In some embodiments of the instant disclosure, after forming the redistribution circuit on the interconnection layer further includes forming an anti-reflection layer on the interconnection layer.

In some embodiments of the instant disclosure, forming the anti-reflection layer on the interconnection layer further includes depositing a dielectric layer covering the redistribution circuit and the interconnection layer, depositing a metal layer covering the dielectric layer and photolithographing the dielectric layer and the metal layer to expose the redistribution circuit.

In some embodiments of the instant disclosure, the dielectric layer includes silicon oxide, and the metal layer includes silver.

In some embodiments of the instant disclosure, forming a packaging layer on the redistribution circuit includes forming a packaging layer covering the redistribution circuit and the interconnection layer and forming an opening on the packaging layer, the opening exposing a portion of the redistribution circuit.

In some embodiments of the instant disclosure, the opening is formed by laser drilling.

In some embodiments of the instant disclosure, the method of manufacturing chip package further includes forming a soldering ball on the packaging layer, and a portion of the soldering ball is disposed on the opening to be electrically connected to the redistribution circuit.

In some embodiments of the instant disclosure, soldering ball includes tin.

In some embodiments of the instant disclosure, the method of manufacturing chip package further includes forming a soldering wire, and one end of the soldering wire is disposed on the opening to be electrically connected to the redistribution circuit.

In some embodiments of the instant disclosure, the redistribution circuit includes aluminium, copper, nickel or an alloy thereof.

According to another embodiment of the instant disclosure, a chip package includes a semiconductor substrate, a redistribution circuit, a packaging layer, a colour filter and a micro-lens module. The semiconductor substrate has at least a photo diode and an interconnection layer. The interconnection layer is disposed on an upper surface of the semiconductor substrate. The interconnection layer is above the photo diode and electrically connected to the photo diode. The redistribution circuit is disposed on the interconnection layer and electrically connected to the interconnection layer. The packaging layer is disposed on the redistribution circuit and formed with an opening to expose a portion of the redistribution circuit. The colour filter is disposed on a lower surface of the semiconductor substrate. The micro-lens module is disposed under the colour filter.

In some embodiment of the instant disclosure, the chip package further includes a soldering ball disposed on the packaging layer. A portion of the soldering ball is over the opening and electrically connected to the redistribution circuit.

In some embodiment of the instant disclosure, the soldering ball includes tin.

In some embodiment of the instant disclosure, the chip package further includes a soldering wire disposed on the opening and electrically connected to the redistribution circuit.

In some embodiment of the instant disclosure, the chip package further includes an anti-reflection layer disposed on the interconnection layer.

In some embodiment of the instant disclosure, the anti-reflection layer includes a dielectric layer disposed on a side of the redistribution circuit and on the interconnection layer and a metal layer disposed on the dielectric layer.

In some embodiment of the instant disclosure, the dielectric layer includes silicon oxide, and the metal layer includes silver.

In some embodiment of the instant disclosure, the chip package further includes an optical glass disposed under the micro-lens module and a glue attachment layer sandwiched between the micro-lens module and the optical glass.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
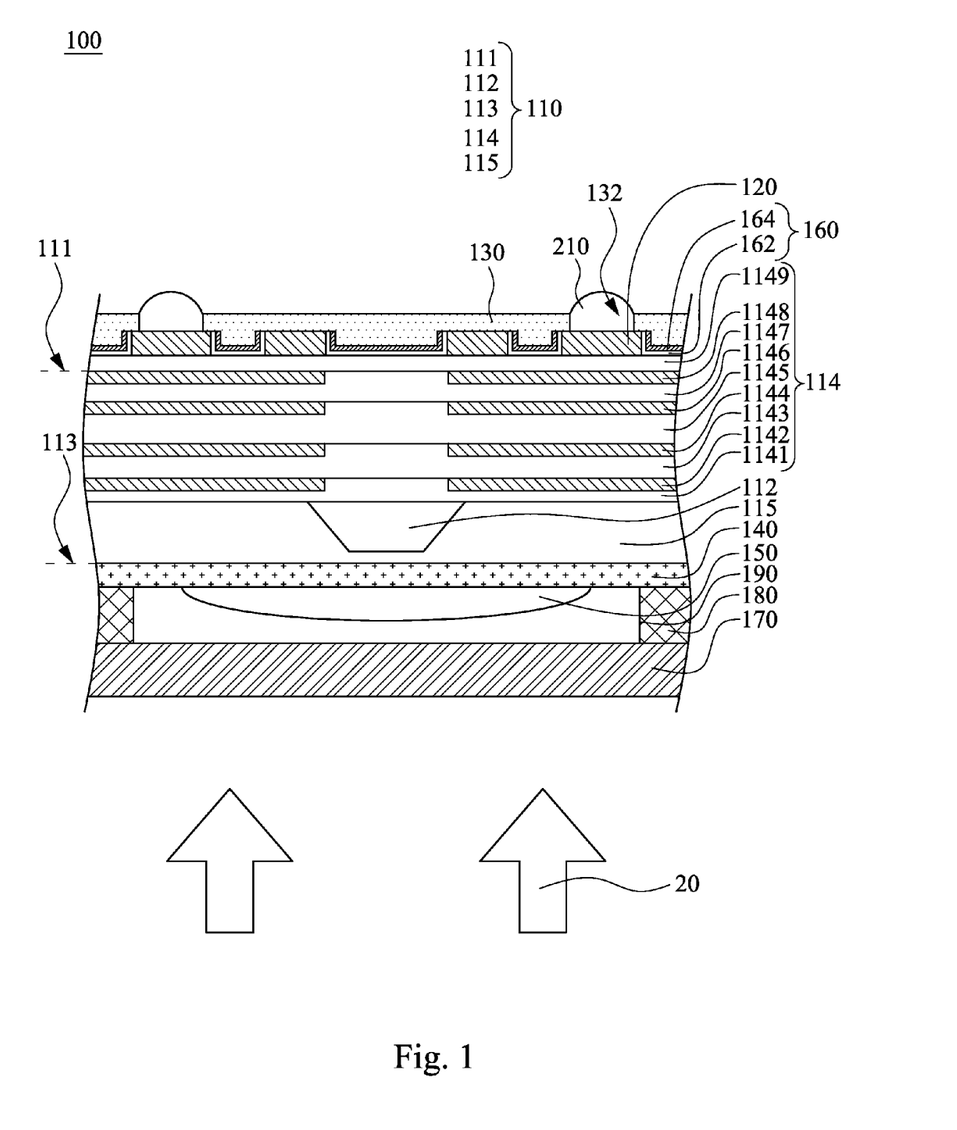
FIG. 1 is a partial cross-sectional view of a chip package in accordance with an embodiment of the instant disclosure.

FIG. 1 is a partial cross-sectional view of a chip package in accordance with an embodiment of the instant disclosure. Please refer to FIG. 1. The chip package 100 includes semiconductor substrate 110, redistribution circuit 120, packaging layer 130, colour filter 140 and micro-lens module 150. The semiconductor substrate 110 has a photo diode 112 and an interconnection layer 114. As shown in FIG. 1, the interconnection layer 114 is disposed on an upper surface 111 of the semiconductor substrate 110. The interconnection layer 114 is above the photo diode 112. The interconnection layer 114 and the photo diode 112 are electrically connected. The photo diode 112 may be, for example, a CMOS image sensor disposed on the semiconductor wafer 115. The semiconductor wafer 115 may be, for example, silicon, germanium or group III-V elements. As shown in FIG. 1, when the photo diode 112 receives the light signal 20, the photo diode 112 can generate electric current positively correlating to the number of photons. That is to say, the photo diode 112 generates a voltage signal of the total number of photons in a given time, and the voltage signal can be output through the interconnection layer 114 that is electrically connected to the photo diode 112. As shown in FIG. 1, the interconnection layer 114 may include multiple-layered of metal interconnections 1142, 1144, 1146, 1148, inter-metal dielectric layers 1141, 1143, 1145, 1147 sandwiched in between each of the metal interconnections and vias (not shown) in between the inter-metal dielectric layer that are electrically connected to each of the metal interconnection. The metal interconnections 1142, 1144, 1146, 1148 include aluminium, copper, nickel or any other suitable conductive materials. The inter-metal dielectric layers 1141, 1143, 1145, 1147, 1149 include silicon oxide, silicon nitride, silicon oxynitride or any other suitable dielectric materials. The metal interconnects 1142, 1144, 1146, 1148 and the inter-metal dielectric layers 1141, 1143, 1145, 1147, 1149 can be formed on the photo diode 112 by suitable manufacturing process in succession. In conjunction with the internal via (not shown), the electrical connection between the interconnection layer 114 and the photo diode 112 can be established. It should be understood that, the semiconductor substrate 110 is similar to the low cost wafer feeding of the front side illuminated structure. In other words, the photo diode is manufactured on the semiconductor substrate. Subsequently, wafer feeding of the interconnection structure is conformingly formed on the photo diode. The process is completely different from the back side illuminated wafer feeding, and there is no need to employ complex steps and precision regulation. The instant disclosure uses the front side illuminated approach to manufacture back side illuminated structure, and therefore the production cost is relatively low which is more suitable for mass production. As shown in FIG. 1, in some embodiments of the instant disclosure, the chip package 100 further includes an anti-reflection layer 160 disposed over the interconnection layer 114. The anti-reflection layer 160 may include one or more anti-reflection layers to reduce incident light being reflected to the photo diode 112 after it goes through the interconnection layer 114. The interference level can then be reduced. The anti-reflection layer 160 can also be seen a light mask disposed on the interconnection layer 114 to shield the light coming from the upper surface 111 of the semiconductor substrate 110, such that the scattering light cannot enter the photo diode 112 to cause incorrect signals. In the instant disclosure, the photo diode 112 only receives incident light 20 from the lower surface 113 of the semiconductor substrate 110, and therefore it is back side illuminated system. As shown in FIG. 1, in some embodiments of the instant disclosure, the anti-reflection layer 160 includes a dielectric layer 162 and a metal layer 164. The dielectric layer 162 is disposed on a side of the redistribution circuit 120 and on the interconnection layer 114. The metal layer 164 is disposed on the dielectric layer 162. The materials of the dielectric layer 162 and the metal layer 164 may vary according to design requirement. In some embodiments of the instant disclosure, the dielectric layer 162 includes silicon oxide, and the metal layer 164 includes silver.

Please still refer to FIG. 1. The redistribution circuit 120 is disposed on the interconnection layer 114, and the redistribution circuit 120 is electrically connected to the interconnection layer 114. The redistribution circuit 120 may be made of aluminium, copper, nickel or any other suitable conductive materials and deposited over the interconnection layer 114 through suitable process. Then, the redistribution circuit 120 is patterned through photolithography. The electrical connection between the redistribution circuit 120 and the interconnection layer 114 can be achieved in different ways. For example, an opening is formed on the upper most inter-metal dielectric layer 1149 of the interconnection layer 114 to expose a portion of the metal interconnections 1148. Then, conductive materials are filled into the opening, such that the redistribution circuit 120 formed in the subsequent process can be electrically connected to the interconnection layer 114. The voltage signal generated from the photo diode 112 can then be transmitted through the path. Please refer to FIG. 1. The packaging layer 130 is disposed on the redistribution circuit 120. The packaging layer 130 is formed with an opening 132 to expose a portion of the redistribution circuit 120. The packaging layer 130 may be made of, for example, silicon oxide, silicon nitride, silicon oxynitride or any other suitable insulating materials. The packaging layer 130 may be formed by chemical vapor deposition conforming to the redistribution circuit 120 and planarized by chemical mechanical polishing. The packaging layer 130 may be solder mask or other suitable packaging materials to form on the redistribution circuit 120 by spreading.

Please still refer to FIG. 1. The colour filter 140 is disposed on the lower surface 113 of the semiconductor substrate 110. The colour filter 140 allows light having specific wavelength to shine on the photo diode 112. In other words, the colour filter 140 limits the range of wavelength that enters the photo diode 112, and the light with other wavelengths is rejected. The colour filter 140 determines what type of light can be absorbed by the photo diode 112 and generate relevant voltage signal. For example, the colour filter 140 may be red, green and blue filter, or the array of these colours. In addition, the colour filter may include other light filter, for example, cyan, yellow or magenta. The colour filter 140 may include paint or dye, for example, acrylic resin having paint or dye. The material and the means of formation of the colour filter 140 are not limited in the instant disclosure. For example, the colour filter 140 may be polymethy-methacrylate (PMMA) having paint or dye or polyglycidylmethacrylate (PGMS) having paint or dye. Please refer to FIG. 1. The micro-lens module 150 is disposed under the colour filter 140. The micro-lens module 150 may be used to concentrate the incident light 20. The incident light 20 is firstly concentrated and then passes the colour filter 140 to the photo diode 112. Thus, the micro-lens module 150 can increase the system efficiency of the chip package 100. The colour filter 140 and the micro-lens module 150 can be spread or by other deposition method to form as a layer and undergo photolithography for patterning the layer. For example, a light mask on the layer may be used to form an etching mask, and the light mask is removed after the patterning process. The material, shape, thickness and method of formation of the micro-lens module 150 are not limited thereto. For example, the micro-lens module 150 may be made of acrylic acid polymer that has higher permeability. The thickness of the micro-lens module 150 is variable according to optical considerations with associated components. The fabrication of the micro-lens module 150 may be spin coating, such that the micro-lens module 150 can have uniform thickness. However, the instant disclosure is not limited thereto. The fabrication of the micro-lens module 150 may be chemical vapour deposition or physical vapour deposition. As shown in FIG. 1, in some embodiments of the instant disclosure, the chip package 100 further includes an optical glass 170 and a glue attachment layer 180. The optical glass 170 is disposed under the micro-lens module 150. The glue attachment layer 180 is sandwiched between the micro-lens module 150 and the optical glass 170. The optical glass 170 is attached to the micro-lens module 150 through the glue attachment layer 180 so as to protect the micro-lens module 150. In some embodiments of the instant disclosure, the chip package 100 further includes a spacer 190 in between the optical glass 170 and the micro-lens module 150 for sufficient physical support.

Please still refer to FIG. 1. In some embodiments of the instant disclosure, the chip package 100 further includes a soldering ball 210 disposed on the packaging layer 130. A portion of the soldering ball is over the opening 132 and electrically connected to the redistribution circuit 120. The material of the soldering ball 210 may be any metal or alloy suitable for soldering purpose. In some embodiments of the instant disclosure, the soldering ball 210 includes tin (Sn). The soldering ball 210 acts as a connection bridge between the chip package 100 and the external printed circuit board or other interposer. Accordingly, the voltage signal detected by the photo diode 112 can be output through the interconnection layer 114, redistribution circuit 120 and the soldering ball 210. For example, the soldering ball 210 may further be electrically connected to a printed circuit board and other interposer, and the voltage signal detected by the photo diode 112 can be output to the printed circuit board and the interposer. The input/output current signal from printed circuit board or other interposer can control the signal input of the photo diode 112 through the soldering ball 210, redistribution circuit 120 and the interconnection layer 114. In some embodiments of the instant disclosure, the chip package 100 may further include a soldering wire (not shown) electrically connected to the redistribution circuit 120. The soldering wire can be a connection bridge between the chip package 100 and external printed circuit board or other interposer. The method of manufacturing the chip package 100 will be elaborated hereafter in FIGS. 2 to 11.

Figure 2:
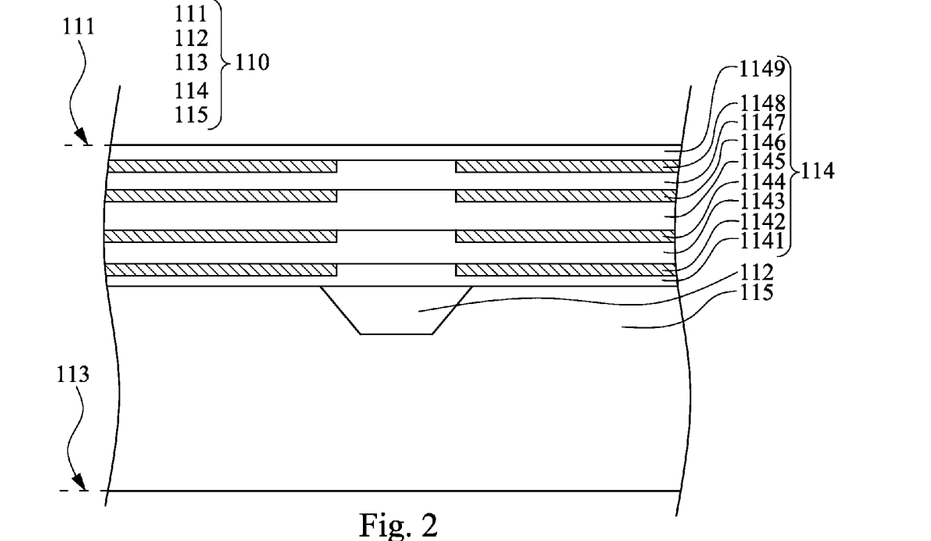
FIG. 2 is cross-sectional view in a step of manufacturing a chip package in accordance with an embodiment of the instant disclosure.
Figure 3:
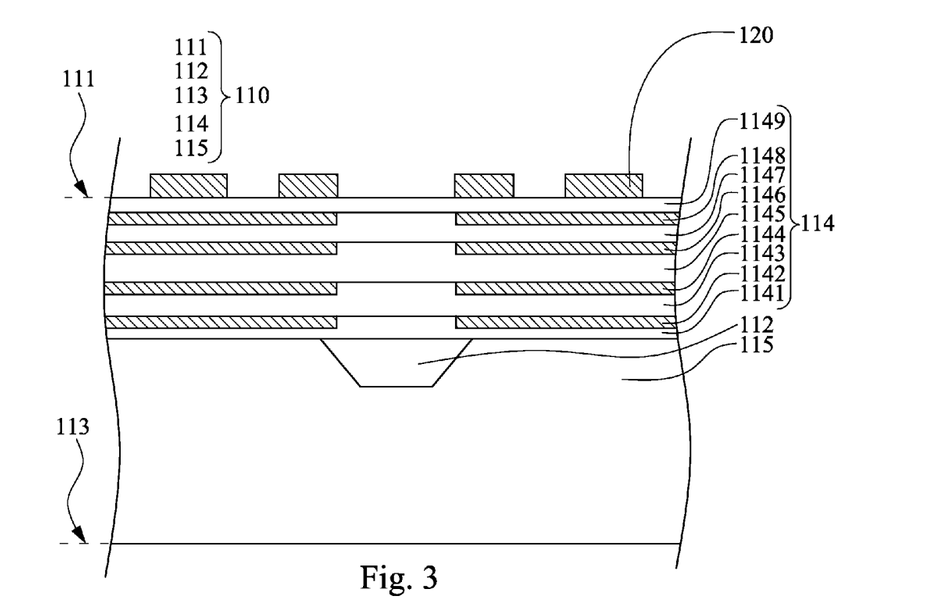
FIG. 3 is cross-sectional view in a step following FIG. 2 of manufacturing a chip package in accordance with an embodiment of the instant disclosure.

FIG. 2 is cross-sectional view in a step of manufacturing a chip package in accordance with an embodiment of the instant disclosure. FIG. 3 is cross-sectional view in a step following FIG. 2 of manufacturing a chip package in accordance with an embodiment of the instant disclosure. Please refer to FIG. 2. A semiconductor substrate 110 is provided having a photo diode 112 and an interconnection layer 114 disposed on the upper surface 111 of the semiconductor substrate 110. The interconnection layer 114 is above the photo diode 112. The interconnection layer 114 and the photo diode 112 are electrically connected. The photo diode 112 may be, for example, a CMOS image sensor disposed on the semiconductor wafer 115. The semiconductor wafer 115 may be, for example, silicon, germanium or group III-V elements. The interconnection layer 114 is disposed on the upper surface 111 of the semiconductor substrate 110 and above the photo diode 112. The interconnection layer 114 and the photo diode 112 are electrically connected. The method of fabrication, structural details and relationship between the photo diode 112 and the interconnection layer 114 have been discussed previously and will not repeated hereafter to avoid redundancy. Please refer to FIG. 3. After providing the semiconductor substrate 110, at least a redistribution circuit 120 is formed on the interconnection layer 114. The redistribution layer 120 is electrically connected to the interconnection layer 114. The redistribution circuit 120 may be made of aluminium, copper, nickel or any other suitable conductive materials and completely deposited over the interconnection layer 114 through suitable process. Then, the redistribution circuit 120 is patterned through photolithography. The electrical connection between the redistribution circuit 120 and the interconnection layer 114 can be achieved by the following means. For example, an opening is formed on the inter-metal dielectric layer of the interconnection layer 114 to expose a portion of the metal interconnections. Then, conductive materials are filled into the opening, such that the redistribution circuit 120 formed in the subsequent process can be electrically connected to the interconnection layer 114. The voltage signal generated from the photo diode 112 can then be transmitted through the path.

Figure 4:
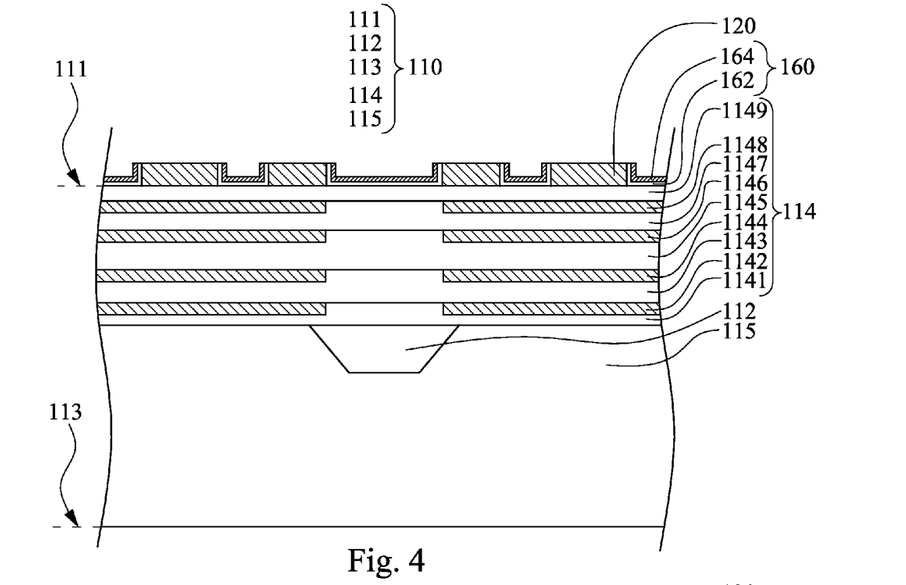
FIG. 4 is cross-sectional view in a step following FIG. 3 of manufacturing a chip package in accordance with an embodiment of the instant disclosure.
Figure 5:
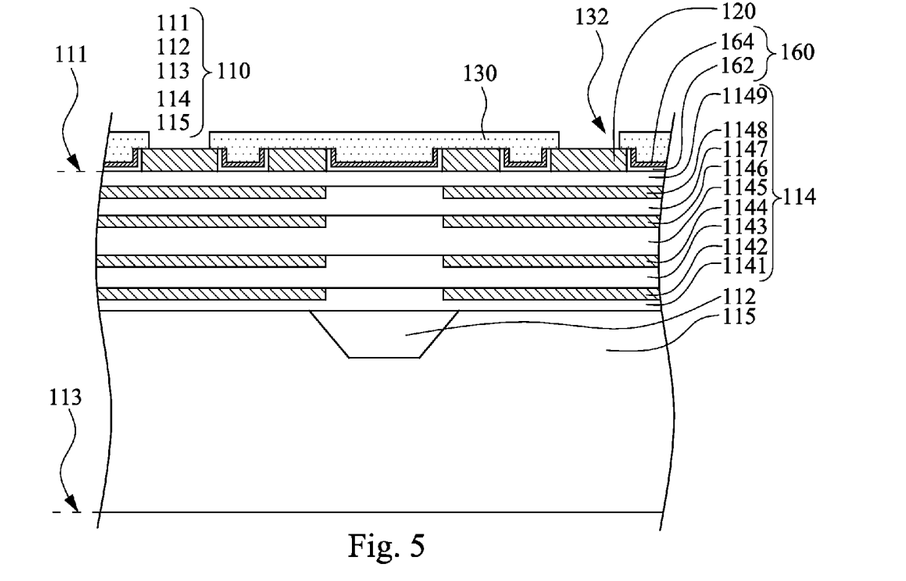
FIG. 5 is cross-sectional view in a step following FIG. 4 of manufacturing a chip package in accordance with an embodiment of the instant disclosure.

FIG. 4 is cross-sectional view in a step following FIG. 3 of manufacturing a chip package in accordance with an embodiment of the instant disclosure. FIG. 5 is cross-sectional view in a step following FIG. 4 of manufacturing a chip package in accordance with an embodiment of the instant disclosure. Please refer to FIG. 4. In some embodiments of the instant disclosure, after the formation of the redistribution layer 120 on the interconnection layer 114, an anti-reflection layer 160 is formed on the interconnection layer 114. The anti-reflection layer 160 reduces incident light being reflected to the photo diode 112 after it goes through the interconnection layer 114. The interference level can then be reduced. The anti-reflection layer 160 can also be seen a light mask disposed on the interconnection layer 114 to shield the light coming from the upper surface 111 of the semiconductor substrate 110 such that the scattering light cannot enter the photo diode 112 to cause incorrect signals. The photo diode 112 only receives incident light 20 from the lower surface 113 of the semiconductor substrate 110, and therefore it is back side illuminated system. The anti-reflection layer 160 may be formed on the interconnection layer 114 by any suitable method. In some embodiments of the instant disclosure, the formation of the anti-reflection layer 160 on the interconnection layer 114 includes depositing the dielectric layer 162 covering the redistribution layer 120 and the interconnection layer 114, and then the metal layer 164 is deposited to cover the dielectric layer 162. Finally the dielectric layer 162 and the metal layer 164 undergo photolithography to expose the redistribution circuit 120 to form the structure shown in FIG. 4. The materials of the dielectric layer 162 and the metal layer 164 may vary according to design requirement. In some embodiments of the instant disclosure, the dielectric layer 162 includes silicon oxide, and the metal layer 164 includes silver. Please refer to FIG. 5. The packaging layer 130 is formed on the redistribution circuit 120. The packaging layer 130 may be made of, for example, silicon oxide, silicon nitride, silicon oxynitride or any other suitable insulating materials. The packaging layer 130 may be formed by chemical vapor deposition conforming to the redistribution circuit 120 and planarized by chemical mechanical polishing. The packaging layer 130 may be solder mask or other suitable packaging materials to form on the redistribution circuit 120 by spreading. However, the method of forming the packaging layer 130 is not limited thereto, and it may vary according to process deviation. In some embodiments of the instant disclosure, the formation of the packaging layer 130 over the redistribution circuit 120 further includes forming the packaging layer 130 to cover the redistribution circuit 120 and the interconnection layer 114. Subsequently, as shown in FIG. 5, an opening 132 is formed on the packaging layer 130. The opening 132 exposes a portion of the redistribution circuit 120. The opening 132 of the packaging layer 130 may be formed by dry etching, wet etching, laser drilling or any other suitable process. In some embodiments of the instant disclosure, the opening 132 of the packaging layer 130 is formed by laser drilling. Thus, the contamination caused by etching solution on the unit in the wet etching or dry etching may be avoided.

Figure 6:
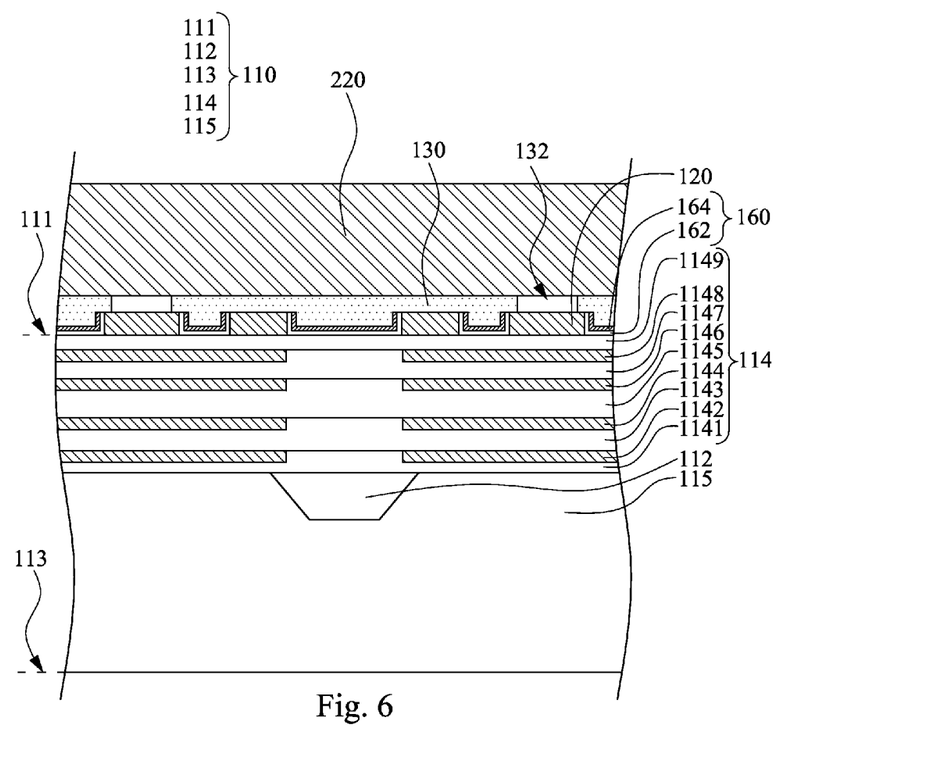
FIG. 6 is cross-sectional view in a step following FIG. 5 of manufacturing a chip package in accordance with an embodiment of the instant disclosure.
Figure 7:
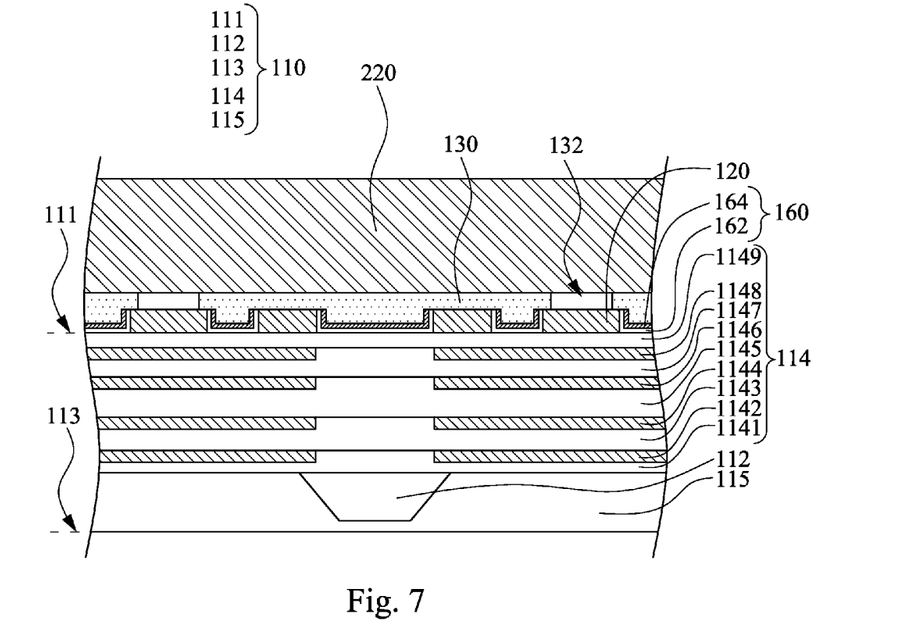
FIG. 7 is cross-sectional view in a step following FIG. 6 of manufacturing a chip package in accordance with an embodiment of the instant disclosure.

FIG. 6 is cross-sectional view in a step following FIG. 5 of manufacturing a chip package in accordance with an embodiment of the instant disclosure. FIG. 7 is cross-sectional view in a step following FIG. 6 of manufacturing a chip package in accordance with an embodiment of the instant disclosure. Please refer to FIG. 6. After the formation of the packaging layer 130 on the redistribution circuit 120, the carrier substrate 220 is attached to the packaging layer 130. The carrier substrate 220 may be a glass substrate, semiconductor substrate or any other substrate that is sufficiently robust to sustain the pressure in the subsequent process. The attachment of the carrier substrate 220 may be, for example, using light sensitive or heat sensitive glue, such that when the subsequent process is complete, the carrier substrate 220 can be removed by light exposure or heating. Please refer to FIG. 7. In some embodiments of the instant disclosure, after attaching the carrier substrate 220 to the packaging layer 130, the semiconductor substrate 110 is thinned from the lower surface 113 toward the upper surface 111. Thus, the photo diode 112 on the semiconductor wafer 115 can receive light signal entering from the lower surface 113. The photo diode 112 faithfully reflects the voltage signal of the number of photons in a given time. Thinning the semiconductor substrate 110 may vary according to design requirement. In some embodiments of the instant disclosure, thinning the semiconductor substrate 110 from the lower surface 110 toward the upper surface 111 can be conducted by mechanical polishing, chemical base polishing, chemical mechanical polishing or the combination thereof.

Figure 8:
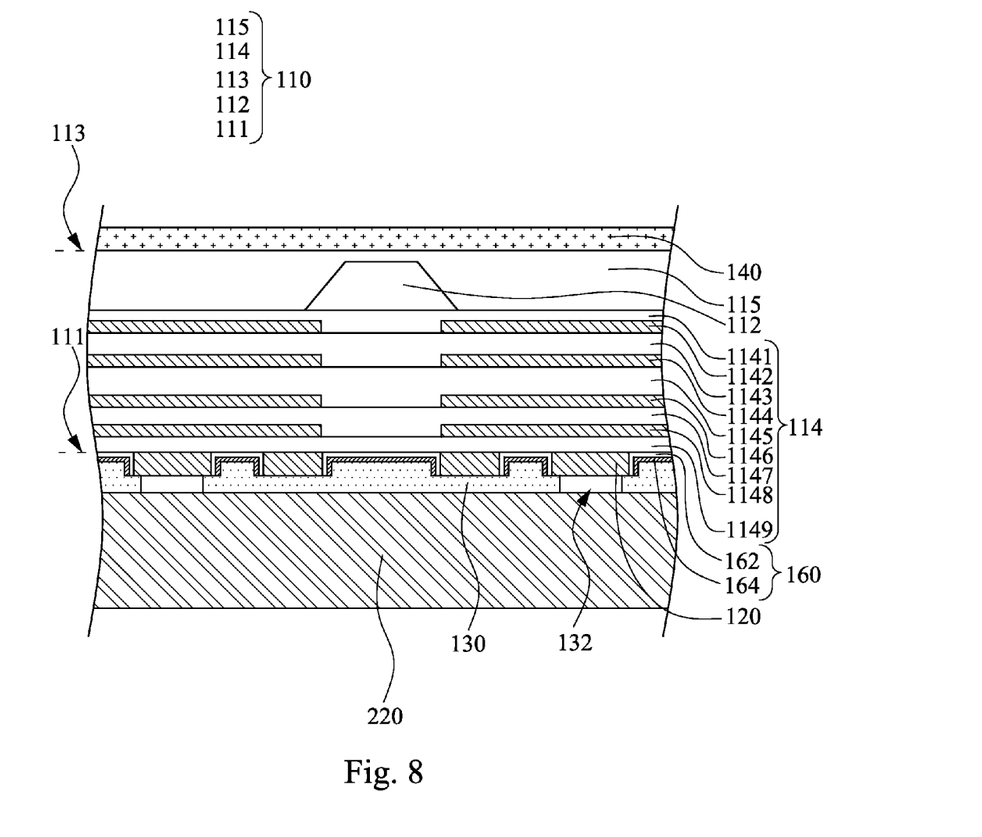
FIG. 8 is cross-sectional view in a step following FIG. 7 of manufacturing a chip package in accordance with an embodiment of the instant disclosure.
Figure 9:
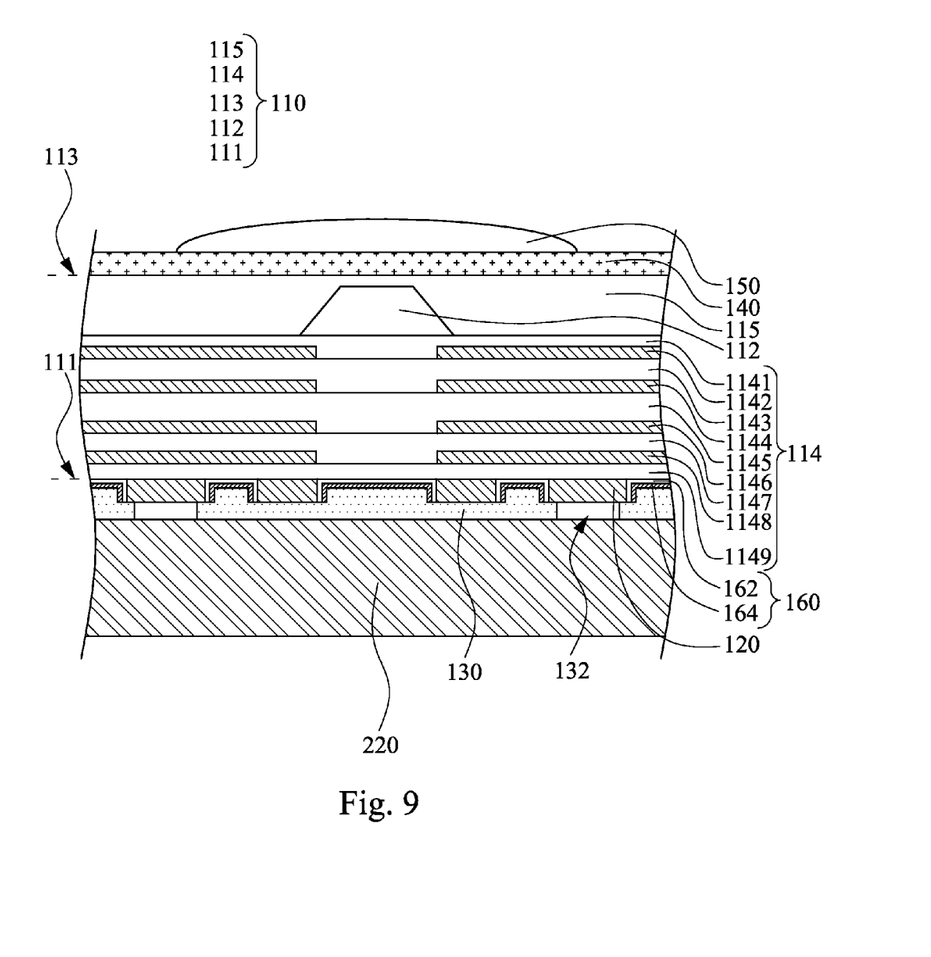
FIG. 9 is cross-sectional view in a step following FIG. 8 of manufacturing a chip package in accordance with an embodiment of the instant disclosure.

FIG. 8 is cross-sectional view in a step following FIG. 7 of manufacturing a chip package in accordance with an embodiment of the instant disclosure. FIG. 9 is cross-sectional view in a step following FIG. 8 of manufacturing a chip package in accordance with an embodiment of the instant disclosure. Please refer to FIG. 8. the colour filter 140 is formed on the lower surface 113 of the semiconductor substrate 220. It should be understood that, after the carrier substrate 220 is attached to the packaging layer 130, the subsequent process can be done in flipped mode. As shown in FIG. 8, the semiconductor substrate 110 is flipped such that the lower surface 113 faces upwardly, and the colour filter 140 is formed on the lower surface 113. The colour filter 140 allows light having specific wavelength to shine on the photo diode 112, and the light with other wavelengths is rejected. The colour filter 140 determines what type of light can be absorbed by the photo diode 112 and generate relevant voltage signal. Please refer to FIG. 9. The micro-lens module 150 is formed under the colour filter 140. The micro-lens module 150 may be used to concentrate the incident light 20. The incident light 20 is firstly concentrated and then passes the colour filter 140 to the photo diode 112. Thus, the micro-lens module 150 can increase the system efficiency of the chip package 100. The colour filter 140 and the micro-lens module 150 can be spread or by other deposition method to form as a layer and undergo photolithography for patterning the layer. For example, a light mask on the layer may be used to form an etching mask, and the light mask is removed after the patterning process. The material, shape, thickness and method of formation of the micro-lens module 150 are not limited thereto. For example, the micro-lens module 150 may be made of acrylic acid polymer that has higher permeability. The thickness of the micro-lens module 150 is variable according to optical considerations with associated components. The fabrication of the micro-lens module 150 may be spin coating, such that the micro-lens module 150 can have uniform thickness. However, the instant disclosure is not limited thereto. The fabrication of the micro-lens module 150 may be chemical vapour deposition or physical vapour deposition.

Figure 10:
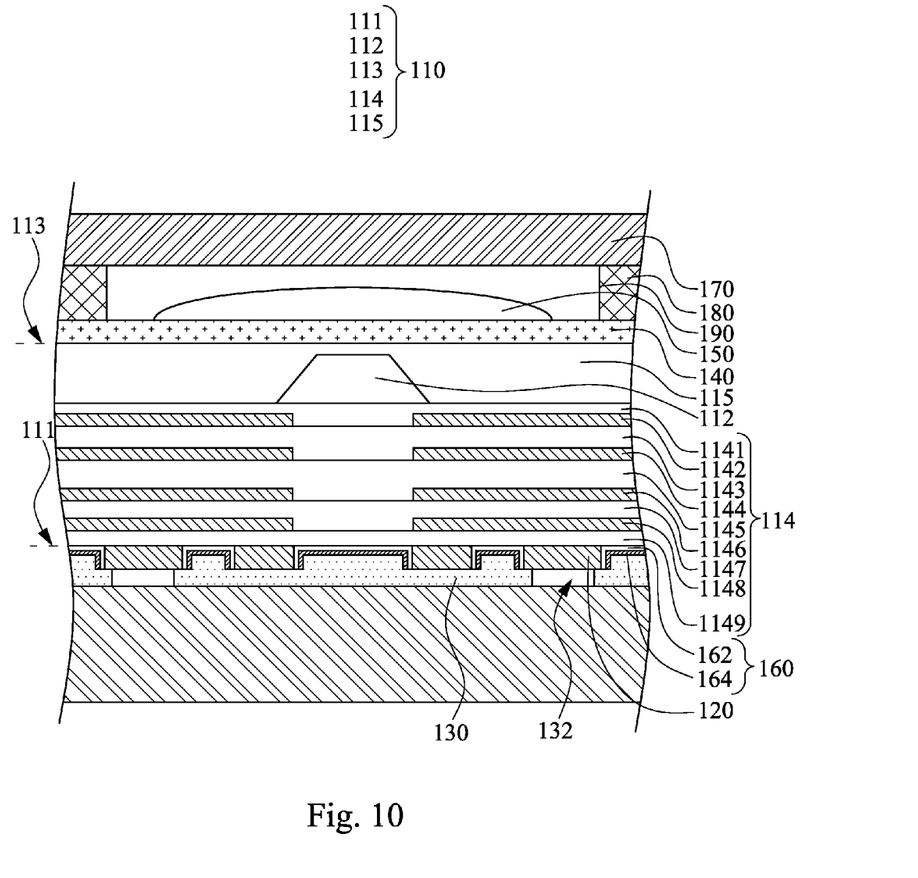
FIG. 10 is cross-sectional view in a step following FIG. 10 of manufacturing a chip package in accordance with an embodiment of the instant disclosure.
Figure 11:
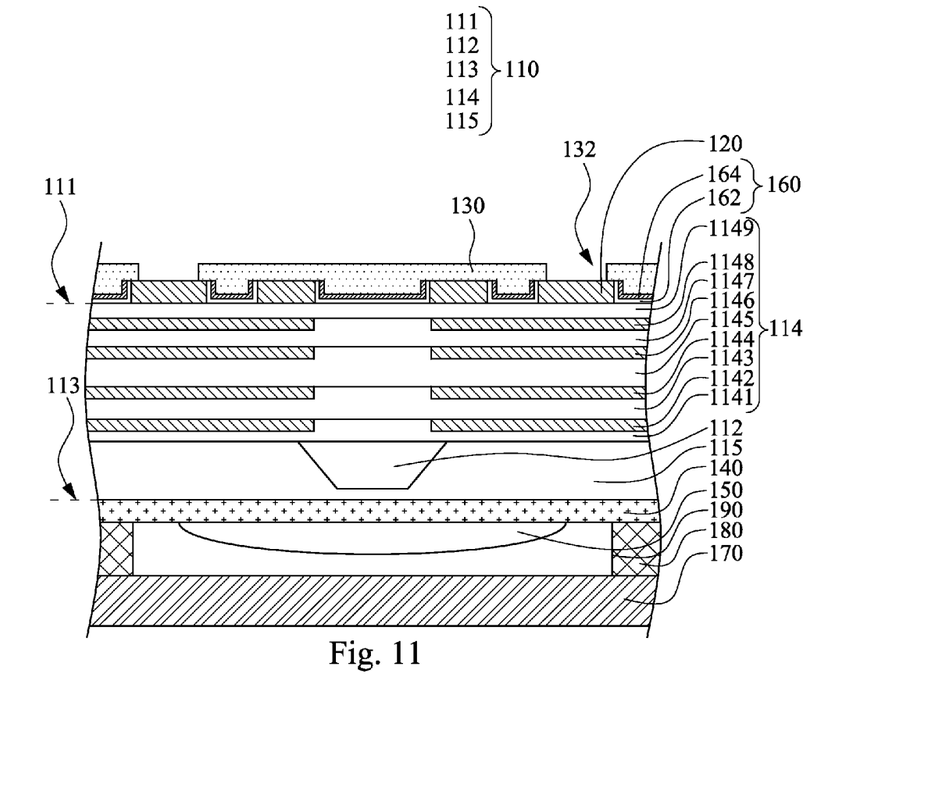
FIG. 11 is cross-sectional view in a step following FIG. 10 of manufacturing a chip package in accordance with an embodiment of the instant disclosure.

FIG. 10 is cross-sectional view in a step following FIG. 10 of manufacturing a chip package in accordance with an embodiment of the instant disclosure. FIG. 11 is cross-sectional view in a step following FIG. 10 of manufacturing a chip package in accordance with an embodiment of the instant disclosure. Please refer to FIG. 10. In some embodiments of the instant disclosure, after the formation of the micro-lens module 150 under the colour filter 140, the optical glass 170 and the glue attachment layer 180 is formed underneath the micro-lens module 150 for a thorough protection of the micro-lens module 150. The glue attachment layer 180 is sandwiched between the micro-lens module 150 and the optical glass 170. The optical glass 170 may be any glass material with high light permeability. The optical glass 170 is attached to the micro-lens module 150 through the glue attachment layer 180 so as to protect the micro-lens module 150. As shown in FIG. 10, in some embodiments of the instant disclosure, a spacer 190 is formed to provide sufficient physical support in between the optical glass 170 and the micro-lens module 150. Please refer to FIG. 11. After the formation of the micro-lens 150 underneath the colour filter 140, the carrier substrate 220 is removed. As previously discussed, the carrier substrate 220 may be attached through light sensitive or heat sensitive glue, and it can be removed by light exposure or heating to reduce its attachment ability, therefore removing the carrier substrate 220. In some embodiments of the instant disclosure, the soldering ball 210 is formed on the packaging layer 130. A portion of the soldering ball 210 is disposed on the opening 132 to electrically connect to the redistribution circuit 120 so as to form the chip package 100 shown in FIG. 1. The material of the soldering ball 210 may be any metal or alloy suitable for soldering purpose. In some embodiments of the instant disclosure, the soldering ball 210 includes tin (Sn). The soldering ball 210 acts as a connection bridge between the chip package 100 and the external printed circuit board or other interposer. Accordingly, the voltage signal detected by the photo diode 112 can be output through the interconnection layer 114, redistribution circuit 120 and the soldering ball 210. For example, the soldering ball 210 may further be electrically connected to a printed circuit board and other interposer, and the voltage signal detected by the photo diode 112 can be output to the printed circuit board and the interposer. In some embodiments of the instant disclosure, a soldering wire (not shown) is formed. One end of the soldering wire is disposed in the opening 132 to electrically connect to the redistribution circuit 120. The soldering wire can also act as a connection bridge between the chip package 100 to external printed circuit board and the other interposer.

In summary, the instant disclosure provides a chip package and method of manufacturing the same. The general back side illuminated wafer feeding is not used. In the back side illuminated system, firstly an epitaxial layer is deposited on the semiconductor substrate to form the interconnection structure that electrically connects each pixel. Subsequently, the photo diode is formed on the interconnection structure of a higher coast wafer feeding. The instant disclosure provides a back side illuminated chip package that is made by front-side-illuminated like wafer feeding which can reduce production cost and more suitable for mass production. In addition, the chip package and method of manufacturing the chip package does not require TSV so as to save production process and cost, and the profile of the chip package is greatly reduced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing chip package, comprising:
providing a semiconductor substrate having at least a photo diode and an interconnection layer disposed on an upper surface of the semiconductor substrate, the interconnection layer being above the photo diode and electrically connected to the photo diode;
forming at least a redistribution circuit on the interconnection layer, the redistribution circuit electrically connected to the interconnection layer;
forming a packaging layer on the redistribution circuit;
attaching a carrier substrate to the packaging layer;
forming a colour filter on a lower surface of the semiconductor substrate;
forming a micro-lens module under the colour filter; and
removing the carrier substrate.

2. The method of manufacturing chip package of claim 1, wherein before forming the colour filter under the semiconductor substrate further comprises:
thinning the semiconductor substrate from the lower surface towards the upper surface.

3. The method of manufacturing chip package of claim 2, wherein thinning the semiconductor substrate from the lower surface towards the upper surface is conducted by mechanical polishing, chemical base etching, chemical mechanical polishing or the combination thereof.

4. The method of manufacturing chip package of claim 1, wherein after forming the redistribution circuit on the interconnection layer further comprises:
forming an anti-reflection layer on the interconnection layer.

5. The method of manufacturing chip package of claim 4, wherein forming the anti-reflection layer on the interconnection layer further comprises:
depositing a dielectric layer covering the redistribution circuit and the interconnection layer;
depositing a metal layer covering the dielectric layer; and
photolithographing the dielectric layer and the metal layer to expose the redistribution circuit.

6. The method of manufacturing chip package of claim 5, wherein the dielectric layer includes silicon oxide, and the metal layer includes silver.

7. The method of manufacturing chip package of claim 1, wherein forming a packaging layer on the redistribution circuit further comprises:
forming a packaging layer covering the redistribution circuit and the interconnection layer; and
forming an opening on the packaging layer, the opening exposing a portion of the redistribution circuit.

8. The method of manufacturing chip package of claim 7, wherein the opening is formed by laser drilling.

9. The method of manufacturing chip package of claim 7 further comprising:
forming a soldering ball on the packaging layer, a portion of the soldering ball disposed on the opening to be electrically connected to the redistribution circuit.

10. The method of manufacturing chip package of claim 9, wherein soldering ball includes tin.

11. The method of manufacturing chip package of claim 7 further comprising:
forming a soldering wire, one end of the soldering wire disposed on the opening to be electrically connected to the redistribution circuit.

12. The method of manufacturing chip package of claim 1, wherein the redistribution circuit includes aluminium, copper, nickel or an alloy thereof.

13. A back side illuminated CMOS image sensor chip package, comprising:
a semiconductor substrate having at least a photo diode and an interconnection layer disposed on an upper surface of the semiconductor substrate, the interconnection layer being above the photo diode and electrically connected to the photo diode;
an anti-reflection layer disposed on the interconnection layer, wherein the anti-reflection layer comprises:
a dielectric layer disposed on a side of the redistribution circuit and on the interconnection layer; and
a metal layer disposed on the dielectric layer;
at least a redistribution circuit disposed on the interconnection layer, the redistribution circuit electrically connected to the interconnection layer;
a packaging layer disposed on the redistribution circuit, the packaging layer formed with an opening to expose a portion of the redistribution circuit;
a colour filter disposed on a lower surface of the semiconductor substrate; and
a micro-lens module disposed under the colour filter.

14. The back side illuminated CMOS image sensor chip package of claim 13 further comprising:
a soldering ball disposed on the packaging layer, a portion of the soldering ball over the opening and electrically connected to the redistribution circuit.

15. The back side illuminated CMOS image sensor chip package of claim 14, wherein the soldering ball includes tin.

16. The back side illuminated CMOS image sensor chip package of claim 13 further comprising:
a soldering wire disposed on the opening and electrically connected to the redistribution circuit.

17. The back side illuminated CMOS image sensor chip package of claim 13, wherein the dielectric layer includes silicon oxide, and the metal layer includes silver.

18. The back side illuminated CMOS image sensor chip package of claim 13 further comprising:
an optical glass disposed under the micro-lens module; and
a glue attachment layer sandwiched between the micro-lens module and the optical glass.

* * * * *